United States Patent
Lin et al.

(10) Patent No.: US 6,342,448 B1
(45) Date of Patent: Jan. 29, 2002

(54) METHOD OF FABRICATING BARRIER ADHESION TO LOW-K DIELECTRIC LAYERS IN A COPPER DAMASCENE PROCESS

(75) Inventors: Jing-Cheng Lin; Shau-Lin Shue, both of Hsinchu; Chen-Hua Yu, Hsin-Chu, all of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/583,401

(22) Filed: May 31, 2000

(51) Int. Cl.$^7$ ............... H01L 21/44; H01L 21/302
(52) U.S. Cl. ............... 438/687; 438/698; 438/682; 438/627; 438/595
(58) Field of Search ............... 438/687, 698, 438/595, 627, 643, 653, 682, 692, 724, 744, 745, 720, 734, 742, 618, 630, 648, 629, 656, 785, 634, 624, 637, 622, 631, 633, 645

(56) References Cited

U.S. PATENT DOCUMENTS

| | | | |
|---|---|---|---|
| 5,814,557 A | | 9/1998 | Venkatraman et al. ...... 438/622 |
| 5,930,669 A | * | 7/1999 | Uzoh ...................... 438/627 |
| 6,001,415 A | | 12/1999 | Nogami et al. ............ 427/97 |
| 6,001,730 A | | 12/1999 | Farkas et al. ............. 438/627 |
| 6,010,962 A | | 1/2000 | Liu et al. ................ 438/687 |
| 6,071,811 A | * | 6/2000 | Ngan ..................... 438/648 |
| 6,093,966 A | * | 7/2000 | Venkatraman et al. ...... 257/751 |
| 6,153,935 A | * | 11/2000 | Edelstein et al. .......... 257/773 |
| 6,207,558 B1 | * | 3/2001 | Singhvi et al. ............ 438/648 |

OTHER PUBLICATIONS

Chang et al., "ULSI Technology", McGraw–Hill, New York, (1996), pp. 444–445.
El Kareh, "Fundamentals of Semiconductor Processing Technologies", Kluwer, Boston, (1995), pp. 563–564.

* cited by examiner

Primary Examiner—Matthew Smith
Assistant Examiner—Igwe U. Anya
(74) Attorney, Agent, or Firm—George O. Saile; Stephen B. Ackerman

(57) ABSTRACT

A method for forming an improved TaN copper barrier for a copper damascene process is described which has improved adhesion to low-k dielectric layers and also improves the wetting of a copper seed layer deposited over it thereby improving the structure of the copper seed layer which is critical to achieving uniform, high quality electrochemical copper deposition. The copper barrier is a composite structure having an lower thin Ta rich TaN portion which mixes into and reacts with the surface of the low-k dielectric layer, forming a strongly bonded transition layer between the low-k material and the remaining portion of the barrier layer. The presence of the transition layer causes compressive film stress rather than tensile stress as found in the conventional TaN barrier. As a result, the barrier layer does not delaminate from the low-k layer during subsequent processing. A second thick central portion of the barrier layer is formed of stoichiometric TaN which benefits subsequent CMP of the copper damascene structure. An upper thin Ta portion improves barrier wetting to the copper seed layer. The three sections of the laminar barrier are sequentially deposited in a single pumpdown operation by IMP sputtering from a Ta target.

20 Claims, 7 Drawing Sheets

METHOD OF FABRICATING BARRIER ADHESION TO LOW-K DIELECTRIC LAYERS IN A COPPER DAMASCENE PROCESS

BACKGROUND OF THE INVENTION (1) Field of the Invention

The invention relates to processes for the manufacture of semiconductor devices and more particularly to the formation of copper interconnective metallization.

(2) Background of the Invention and Description of Related Art

Integrated circuits are manufactured by forming discrete semiconductor devices in the surface of silicon wafers. A multi-level metallurgical interconnection network is then formed over the devices, contacting their active elements, and wiring them together to create the desired circuits. The wiring layers are formed by depositing an insulating layer over the discrete devices, patterning and etching contact openings into this layer, and then depositing conductive material into the openings. A conductive layer is applied over the insulating layer and patterned to form wiring interconnections between the device contacts, thereby creating a first level of basic circuitry. The circuits are then further interconnected by utilizing additional wiring levels laid out over additional insulating layers with conductive via pass throughs. Depending upon the complexity of the overall integrated circuit, several levels of wiring interconnections are used.

For many years, aluminum and aluminum alloys were the most widely used interconnection metallurgies for integrated circuits. Copper had previously been contemplated for replacing aluminum because of it's higher conductivity which results in improved circuit performance. However, a copper metallurgy faced two major problems. Firstly, deposited copper films are difficult to etch in order to form wiring patterns and secondly copper is known to diffuse rapidly in silicon causing junction failure, often referred to as junction poisoning. Copper can also diffuse through insulative layers, degrading them, as well as eventually traveling though them and into device regions.

The problem of forming copper wiring patterns has now been successfully overcome by using a damascene process, whereby openings and trenches, comprising an image of an interconnection pattern, are formed in an insulative layer. Copper is deposited into these openings and over the insulative layer and polished back to the insulative layer leaving a copper wiring pattern, inlaid within the insulative layer. Polishing back of the metal layer is accomplished by CMP (chemical mechanical polishing), a relatively old process which has found new application and refinement in planarization of insulative layers and, more recently, in the damascene process. In a single damascene process a metal line pattern is generated which connects to subjacent vias or contacts. In a dual damascene process, both vias/contacts and an interconnective wiring pattern are formed by a single metal deposition and CMP. A description of both single and dual damascene processes may be found in Chang, C. Y. and Sze, S. M., "ULSI Technology" McGraw-Hill, New York, (1996), p444–445 and in El-Kareh, B., "Fundamentals of Semiconductor Processing Technologies", Kluwer, Boston (1995), p563–4.

The dual damascene process has been particularly favored for the manufacture of integrated circuits using copper metallurgy. Copper is rapidly replacing aluminum as the metallurgy of choice in integrated circuit manufacturing because it has a higher conductivity than aluminum. The use of copper results in greatly improved circuit performance.

The problem of copper migration into the silicon and diffusing into dielectric layers has been overcome by applying a copper diffusion barrier between the copper and the dielectric layers as well as between the copper and the silicon substrate. A variety of effective barrier materials have been reported. These materials, include conductive compounds of transition metals such as tantalum nitride, titanium nitride, and tungsten nitride as well as the various transition metals themselves. Insulators such as silicon nitride, silicon oxynitride and PSG (a phophosilicate glass) are also effective barrier materials between copper metallurgy and insulative layers. Nogami, et. al., U.S. Pat. No. 6,001,415 cites a number of materials, including Ta and TaN, which are effective against copper diffusion. Liu, et. al., U.S. Pat. No. 6,010,962 cites a damascene process wherein Ta is used as a barrier layer.

In order to further improve circuit performance, low dielectric constant (low-k) materials have been incorporated into the dielectric layers of modern integrated circuits. These materials provide a lower capacitance than conventional silicon oxide and consequently, an increase in circuit speed. Examples of low-k dielectric materials include the SOGs (spin-on-glasses). SOGs are formed from alcohol soluble siloxanes or silicates which are spin deposited and baked to form a relatively porous silicon oxide structure. Other porous silica structures such as xerogels have been developed, notably by Texas Instruments Inc. and incorporated into dual damascene processes to obtain dielectric layers with dielectric constants as low as 1.3. This is to be compared with a dielectric constant of about 4 for conventional silicon oxide.

Organic and quasi-organic materials such as polysilsesquioxanes, FSG (fluorinated silica glass) and fluorinated polyarylene ethers have been added to the growing family of low-k and ultra low-k dielectric materials. The totally organic, non silicaceous, materials such as the fluorinated polyarylene ethers, are seeing an increased usage in semiconductor processing technology because of their favorable dielectric characteristics and ease of application. Organosilicate glasses (OSGs), for example Black Diamond™, from Applied Materials Corporation of Santa Clara Calif., have dielectric constants as low as 2.6–2.8. These are low density silicate glasses to which alkyl groups have been added to achieve a low-k.

Farkas, et. al., U.S. Pat. No. 6,001,730 shows a damascene structure with a tantalum based barrier layer on low-k dielectric materials. While Ta is an effective copper barrier, it is difficult to remove over the planar regions by the copper CMP process. TaN is also a more effective as a copper barrier than Ta.

It is found, however, that TaN barrier films deposited directly onto certain low-k dielectric materials, in particular, fluorinated low-k materials such as FSGs and OSGs such as Black Diamond, exhibit poor adhesion. This results in catastrophic delamination of the barrier material, either immediately after deposition or during subsequent processing. De-lamination is produced by high tensile stresses as well as weak bonding between TaN barrier layers and low-k dielectric layers. While Farkas does not admit to barrier adhesion problems with low-k materials, it is known that barrier adhesion to low-k is a serious problem in the industry. Venkatraman, et. al., U.S. Pat. No. 5,814,557 shows a barrier layer for a copper dual damascene process but the layer is not applied onto low-k dielectric layers and therefore barrier adhesion problems are not at issue.

It is therefore desirable to have a method for improving the adhesion of a TaN copper diffusion barrier to low-k dielectric layers. The present invention provides a method which not only greatly improves the adhesion of a TaN barrier layer on a low-k dielectric layer but also improves the interface between the TaN barrier layer and the copper seed layer which is deposited on top of the barrier layer.

SUMMARY OF THE INVENTION

Accordingly, it is an object of this invention to provide a method for forming a well bonded, reduced tensile stress copper barrier layer on low-k dielectric layers.

It is another object of this invention to provide a method for improving the adhesion of a TaN barrier layer on a low-k dielectric layer.

It is yet another object of this invention to provide method for preventing delamination of copper barrier layers deposited onto low-k dielectric layers during thermal processing.

It is still another object of this invention to provide method for improving the wetting capability of a copper barrier layer thereby improving the structure of copper seed layers deposited thereon.

These objects are accomplished by forming a laminar Ta/TaN/Ta barrier layer by depositing an initial Ta rich layer onto a low-k dielectric layer, thereby providing sufficient excess Ta to form a strong tensile stress free interfacial bonding layer, depositing a thicker stoichiometric TaN portion on the Ta rich layer, and finally depositing a second Ta rich layer on the TaN portion to create a Ta enriched surface. The initial Ta is layer is deposited under low Ta deposition rate conditions and in just enough amount to form a transition layer comprising a mixture of Ta and the low-k material. The final Ta rich layer provides a better wetting surface for the subsequently deposited copper seed layer thereby improving the <111> texture of the seed layer. The three graded layers of the barrier are deposited sequentially in a single pumpdown operation using an IMP(ion metal plasma) sputter deposition tool. The initial and final Ta rich layers are deposited at low DC power/high substrate bias conditions, later referred to as Lo/HB, while the stoichiometric TaN middle portion is deposited under conventional power/bias deposition conditions. This allows the three layers to be properly graded into each other thereby reducing interfacial stresses within the barrier.

DESCRIPTION OF THE PREFERRED EMBODIMENTS

Figure 1A:
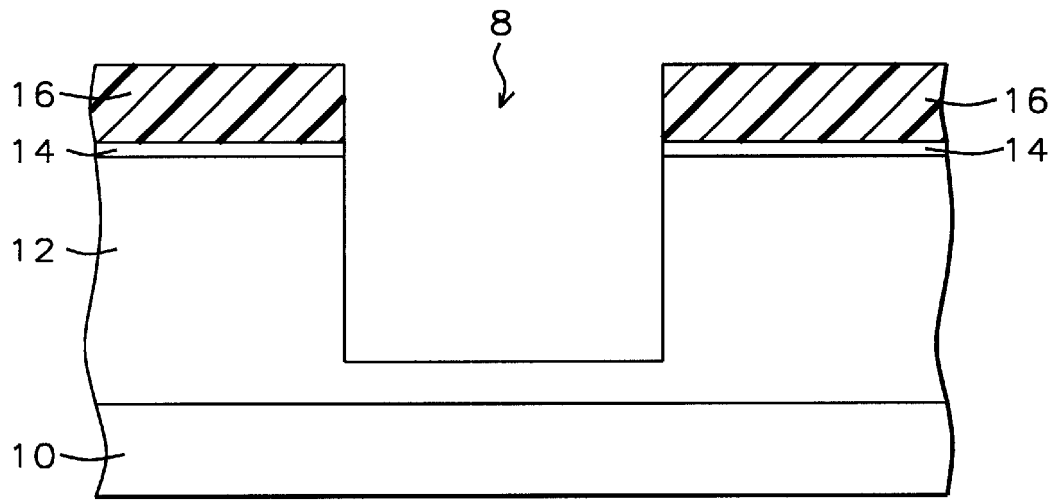
FIG. 1A through FIG. 1D are cross sections of a wafer substrate illustrating a sequence of processing steps for forming an copper conductive element inlaid in a low-k dielectric layer by a damascene process according to a first embodiment of this invention.

In a first embodiment of this invention an copper wiring channel is formed in a low-k dielectric layer. Referring to FIG. 1A, a 200 mm diameter substrate 10 is provided. The substrate 10 is contemplated to be an in process silicon wafer, in which a substructure of semiconductive devices have been formed and, because they are not significant to the invention, they are not described in detail in order to not unnecessarily obscure the present invention.

A low-k dielectric layer 12 is next formed over the wafer 10. A preferred low-k dielectric material is FSG. FSG is a silicon oxyfluoride ($F_X SiO_Y$), deposited by PECVD (plasma enhanced chemical vapor deposition). The gaseous precursors for FSG low-k dielectric layers are silicon tetrafluoride and silane in the presence of oxygen and argon. PECVD procedures and deposition parameters for depositing FSG films are well known and understood by those in the art. The deposited FSG layer has a dielectric constant of about 3.5. Alternately, the dielectric layer 12 may be formed of an OSG, for example Black Diamond™. Black Diamond, a silicate glass doped with carbon in the form of methyl groups, has a dielectric constant of between 2.6 and 2.8 and is available through Applied Materials Corporation of Santa Clara, Calif. The dielectric layer 12 may also alternately be formed of a xerogel, an aerogel, or a polysilsesquioxane. A HDP(High density plasma) CVD technique may alternately be used to deposit the low-k dielectric layer 12.

Photoresist 16 is applied and patterned to form a mask which defines an opening 8. Preferably, an organic BARC (bottom anti-reflective coating) 14 is included beneath the photoresist layer 16 to reduce reflections during photolithographic exposure. Methods of depositing organic BARCs are well known and widely practice in the art. The substrate 10 is then inserted in a deposition chamber of a HDP (high density plasma) etching tool. An opening 8 is etched part way into the low-k dielectric layer 12. The opening 8 comprises a trench into which copper wiring is to be inlaid by a damascene process. In other regions, outside the illustrated cross section, the opening 8 may extend through the dielectric layer, for example in a via region, where the copper wiring will connect to a subjacent wiring layer beneath the dielectric layer 12. Residual photoresist 16 and the BARC 14 are then stripped, preferably by oxygen ashing although, in the alternative, liquid strippers may be used.

Figure 1B:
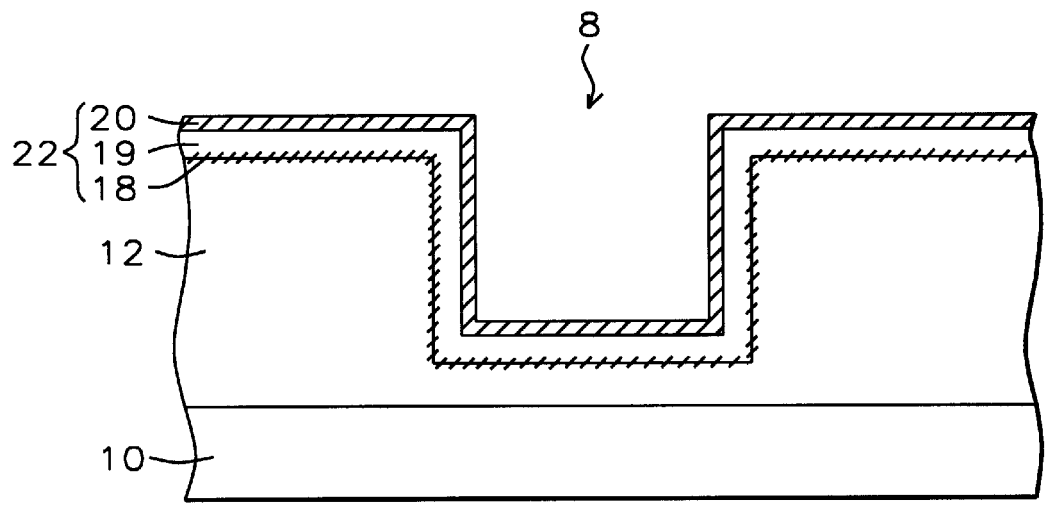

Referring to FIG. 1B, a composite barrier layer 22 is deposited onto the wafer 10 by IMP (ion metal plasma) sputtering, utilizing the directional sputtering characteristics of IMP to provide good bottom coverage. The barrier layer 22 consists three laminar portions. A lower portion 18,which is deposited Ta rich, reacts with the surface of the low-k dielectric layer 12 forming a strongly bonded, transition layer which becomes a tensile stress free adhesion layer for the remaining parts of the barrier 22. A TaN layer 19 is then deposited over the transition region 18 to form the main barrier, and finally, a top layer of Ta 20 is deposited on the central TaN portion to form a good wetting surface for the to-be-deposited copper seed layer. The three laminar components of the composite barrier layer 22 are sequentially deposited in a single pumpdown operation and in the same chamber of the sputtering tool by sequentially changing gas composition and sputtering parameters. Because they are deposited at lower DC power and higher substrate bias power than the central TaN portion, the initial and final Ta rich portions are referred to as deposited under "Lo/HB" conditions. A detailed description of the formation of the composite barrier layer will now described.

The wafer 10 is introduced into the deposition chamber of an ion metal plasma sputtering tool. A suitable commercially available tool is the Endura single-wafer, multi-chamber PVD system fitted with a Vectra IMP source, manufactured by Applied Materials Corporation of Santa Clara Calif. A deposition chamber of the tool is fitted with a tantalum sputtering target which is the tantalum source for all three components of the composite layer 22.

After initial pumpdown, the wafer is heated to a temperature of between about 90 and 110° C. Argon, at a flow rate of between about 40 and 60 SCCM (standard cubic centimeters per minute) is introduced into the deposition chamber. In the present embodiment in which the low-k dielectric is FSG, nitrogen is also introduced at a flow rate of between about 15 and 25 SCCM. If, in the alternative, the low-k dielectric is an OSG, for example, Black Diamond™, the nitrogen flow is omitted. The pumping speed is throttled to maintain a chamber pressure of between about 25 and 30 milliTorr. A Ta rich TaN layer 18 between about 18 and 22 Angstroms thick is deposited onto dielectric layer 12 and into the opening 18 by application of a DC power of between about 45 and 55 Watts to the Ta target, an rf power of between about 2,500 and 3,300 Watts is applied to the coil, and an rf substrate bias of between about 400 and 600 Watts is applied to the wafer. Under these LO/HB conditions, the Ta sputtering rate is low permitting the Ta rich layer 18 to react with the low-k dielectric layer 12 to form a strongly bonded, non tensile stressed adhesion layer 18.

After deposition of the adhesion layer 18, the argon gas flow in the IMP sputtering chamber is changed to between about 40 and 60 SCCM, the nitrogen flow to between about 15 and 30 SCCM and the pumping speed is throttled to maintain a total chamber pressure of between about 25 and 30 milliTorr. DC power is changed to between about 1,350 and 1,650 Watts, the RF power to between about 1,800 and 2,200 Watts, and substrate rf bias to between about 100 and 150 Watts. Under these conditions a stoichiometric TaN barrier layer 19 between about 230 and 285 Angstroms thick, as measured on the planar surface of the wafer, is deposited on the adhesion layer 18. The layer 18 is shown in FIG. 1B as a diffuse transition region, blended both into the subjacent low-k layer 12 and into the superjacent stoichiometric TaN barrier layer 19.

The argon gas flow in the IMP sputtering chamber is then again changed to between about 40 and 60 SCCM, the nitrogen flow is halted, and the pumping speed is throttled to maintain a total chamber pressure of between about 25 and 30 milliTorr. DC power is changed to between about 45 and 55 Watts, the RF power to between about 2,500 and 3,300 Watts, and the substrate rf bias is set to between about 400 and 500 Watts. Under these conditions a Ta top layer 20 between about 18 and 22 Angstroms thick, as measured on the planar surface of the wafer, is deposited on the TaN layer 18. Together, the transition region 18, the TaN layer 19 and the upper Ta layer 20 form the composite barrier layer 22.

Figure 1C:
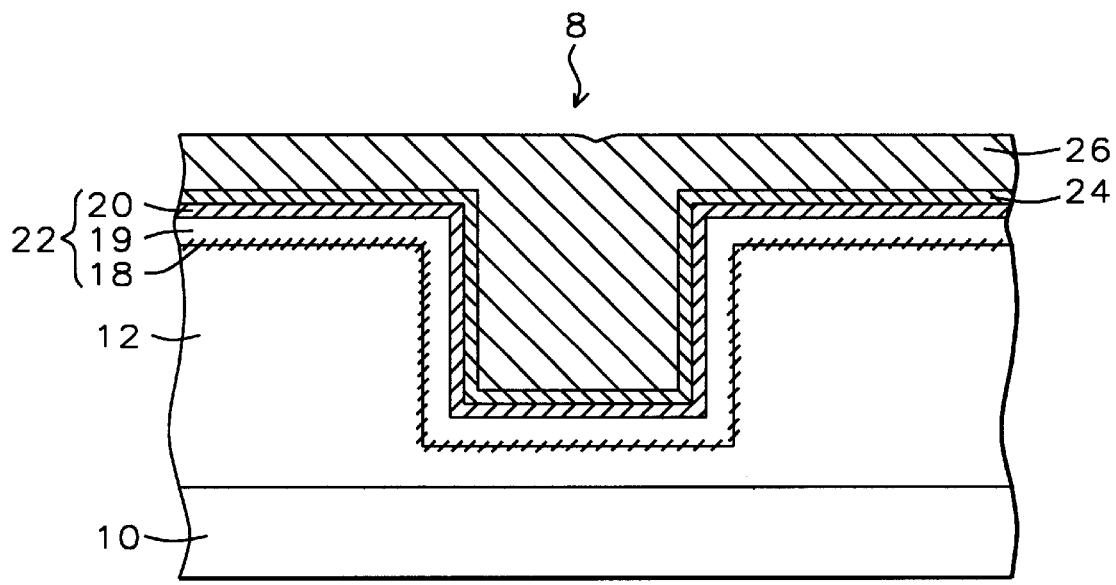

Referring to FIG. 1C a copper seed layer 24, between about 1,200 and 2,500 Angstroms thick, is deposited onto the Ta layer 20. The seed layer 24 is preferably deposited by sputtering in a second chamber of the sputtering tool used to deposit the composite TaN barrier layer 22. Alternately the copper seed layer 24 may be deposited by a CVD method. The upper Ta layer offers a better wetting surface for the copper seed layer 24 than does a corresponding conventional TaN surface, thereby reducing copper agglomeration and increasing the <111> texture of the seed layer. This improved seed layer quality, in turn, greatly improves the uniformity and quality of subsequently electrochemically deposited copper layer which forms the conductive element.

Figure 1D:
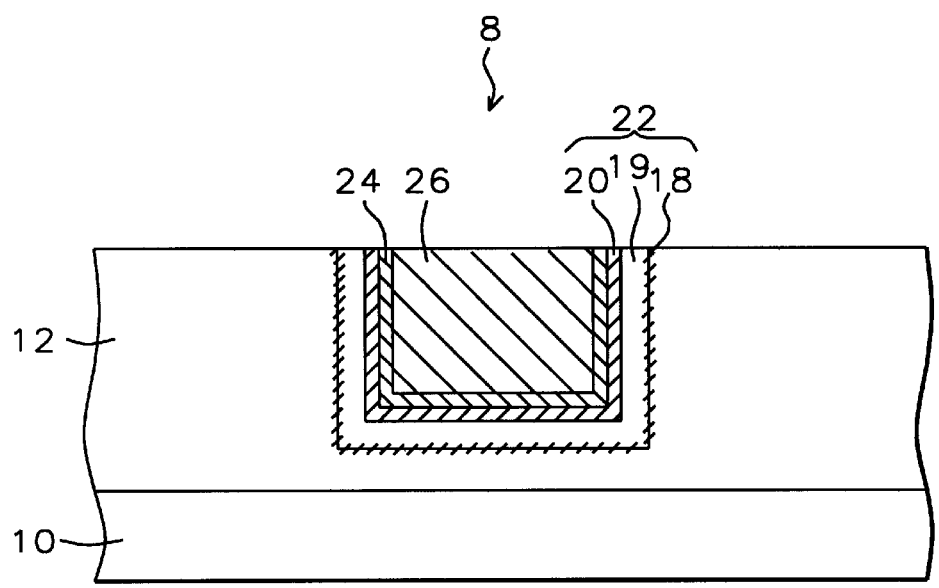

After the copper seed layer is deposited, copper is electroplated onto the seed layer 24, forming a copper layer 26 which fills the opening 8 to above the level of the planar surface of the wafer 10. The formation of copper layers by electrochemical deposition onto copper seed layers is well known and is now widely practiced in copper damascene technology. In keeping with this technology, and referring to FIG. 1D, the excess copper over the surface region of the wafer 10 is next polished away and the surface planarized by CMP. The CMP process uses a slurry containing $Al_2O_3$ to polish the copper down through composite barrier 22 and into the low-k dielectric layer 12 resulting in an isolated copper segment embedded in the opening 8.

Figure 2:
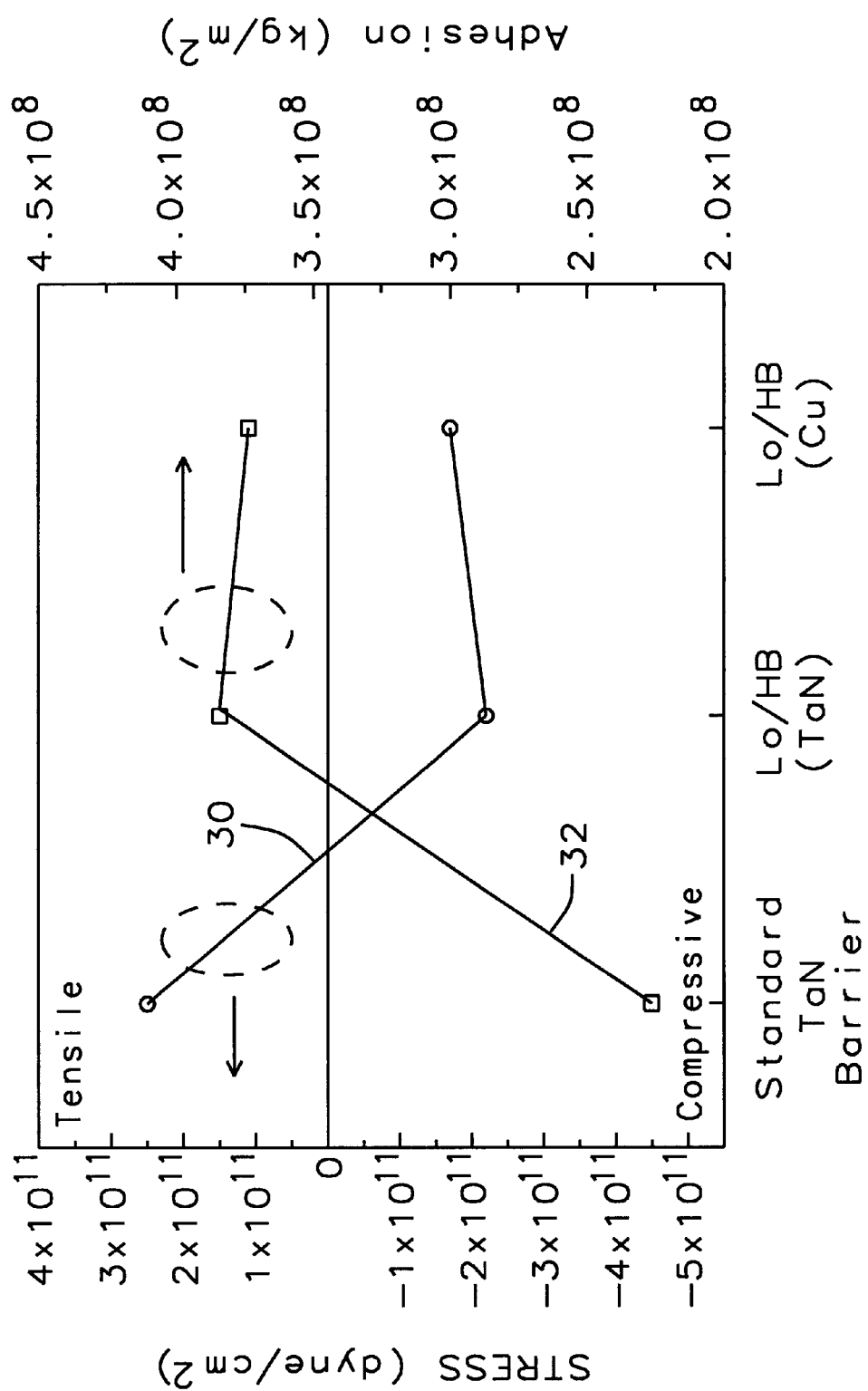
FIG. 2 is a graph which illustrates the stress benefit and the improved adhesion of a barrier layer formed by the method of this invention.

FIG. 2 is a graph which illustrates the stress benefit 30 and the improved adhesion 32 of a barrier layer formed by the method of this invention. The standard TaN barrier is a conventional single composition TaN layer of comparable thickness to the Lo/HB composite barrier. The Lo/HB barrier is the barrier formed with initial and final low DC power/high substrate bias power conditions cited by the present invention. The data points at Lo/HB (TaN) were measured after the barrier layer was deposited. The Lo/HB (Cu) data were measured after the copper damascene structure (FIG. 1D) was completed.

In the conventional, all TaN barrier layer, the film stress is tensile and therefore is easily delaminated. By introducing the thin Lo/HB initial Ta rich portion, the film stress becomes compressive. The corresponding adhesion is improved by a factor of about 3.5. Neither the film stress nor the corresponding adhesion are further affected by the addition of the damascene copper element.

Figure 3A:
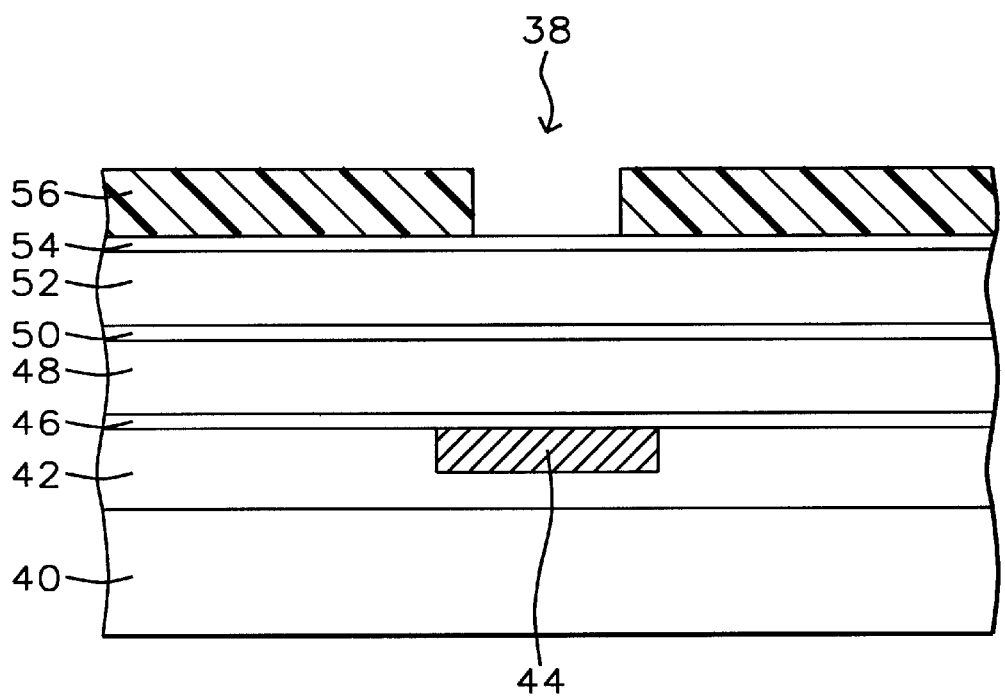
FIG. 3A through FIG. 3G are cross sections of a silicon wafer illustrating a sequence of processing steps for forming a via and a layer of copper metallization inlaid in low-k dielectric layers by a dual damascene process according to a second embodiment of this invention.

In a second embodiment of this invention a copper dual-damascene wiring level is formed in a low-k interlevel dielectric (ILD) layer. Referring to FIG. 3A, a <100> oriented monocrystalline silicon wafer substrate is provided. The silicon substrate 40 is provided with a substructure of devices formed within the substrate 40 and, as they are not significant to the invention, they are not described in detail in order to not unnecessarily obscure the present invention. An insulative layer 42 is formed on the substrate 40 and a wiring layer 44 is formed in the upper portion of the layer 42. Wiring layer 44 may be connected to an underlying structure(not shown) through insulating layer 40. The wiring layer 44 is shown embedded in the figure, having been formed by a damascene process whereby the surface of the insulative layer 42 with the embedded metal wiring 44 is planarized by CMP.

Alternately, the wiring layer may be formed by another process. In the present embodiment the insulative layer 42 is preferably silicon oxide, although it may alternatively be formed of another insulative material, for example BPSG (borophosphosilicate glass) or PSG (phosphosilicate glass). The insulative layer 42 may also be formed of a low-k material. The insulative layer 42 is formed by PECVD (plasma enhanced chemical vapor deposition) although other deposition means may alternately be used to deposit layer 42. However, PECVD is preferred because of the low deposition temperature. The wiring layer 44 is interconnected to elements of the devices located in the wafer 40 substructure and may be formed of aluminum, copper, tungsten, polysilicon, or other conductive material.

A layer of silicon nitride 46 is deposited on the insulative layer 42 by PECVD to a thickness of between about 500 and 1,000 Angstroms. Alternately, another of a number of well known deposition methods may be employed to deposit the layer 46. The silicon nitride layer will serve as an etch stop during subsequent via etching and also performs as a chemical barrier over the insulative layer 42.

A low-k dielectric layer 48 is next formed over the wafer 40. A preferred low-k dielectric material is FSG deposited by PECVD. The gaseous precursors for FSG low-k dielectric layers include silicon tetrafluoride and silane in the presence of oxygen and argon. PECVD procedures and deposition parameters for depositing FSG films are well known and understood by those in the art. The deposited FSG layer has a dielectric constant of about 3.5. Alternately, the dielectric layer 48 may be formed of an OSG, for example Black Diamond™. The dielectric layer 48 may also alternately be formed of a xerogel, an aerogel, or a polysilsesquioxane. A HDP(High density plasma) CVD technique may alternately be used to deposit the low-k dielectric layer 48. The low-k dielectric layer 48 is deposited to a thickness of between about 0.4 and 0.8 microns.

A second layer of silicon nitride 50 is deposited on the low-k layer 48 by PECVD. Alternately, another deposition means may be used to deposit this layer, however, PECVD is preferred because of the low deposition temperature. The silicon nitride layer 50 is deposited to a thickness of between about 200 and 600 Angstroms. A second low-k dielectric layer 52 is deposited on the silicon nitride layer 50 using the same procedures and material choices which used to form the low-k layer 48. The second low-k layer 52 is between about 0.3 and 0.7 microns thick.

Photoresist 56 is applied and patterned to form a mask which defines a via opening 38 overlying the metal wiring 44. An organic BARC 54 is included beneath the photoresist layer 56 to reduce reflections during photolithographic exposure. The wafer 40 is then inserted in a deposition chamber of a HDP etching tool.

Figure 3B:
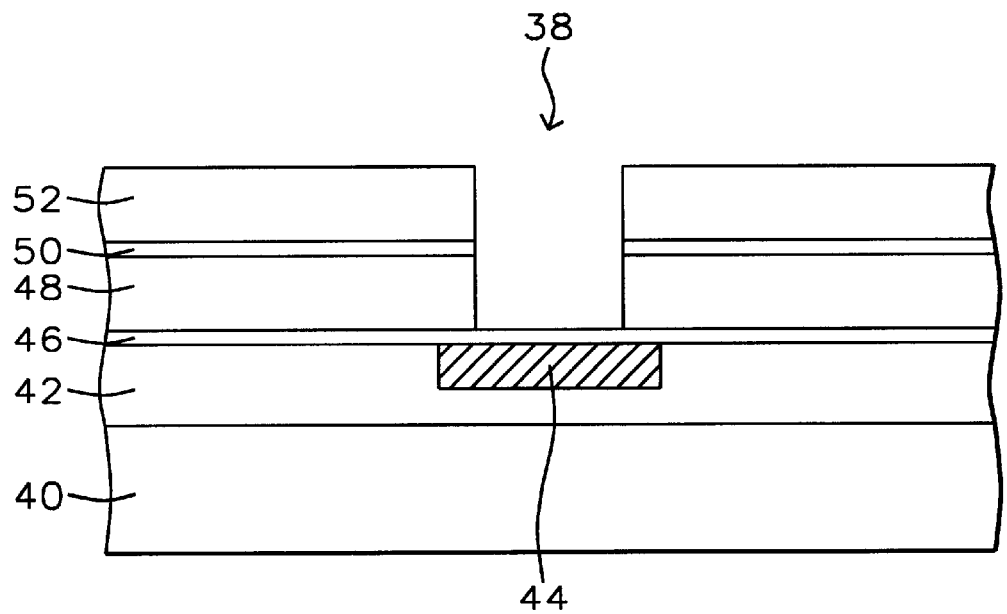

Referring to FIG. 3B the via opening 38 is etched in a single operation by reactive ion etching sequentially, through the organic BARC 54, the low-k dielectric layer 52, the silicon nitride layer 50 and the low-k dielectric layer 48, stopping on the silicon nitride layer 46, reactant gas mixtures and etching parameters are adjusted for each layer to achieve a high etch rate for each layer as it is reached. An endpoint sensor, such as an optical emission spectrometer, provides continuous monitoring of the etching process and indicates when etchant gases are to be changed to accommodate either a nitride layer or an insulative layer. The nitride layer 50 is etched with a gas mixture containing a fluorocarbon such as $CF_4$ and oxygen, while the low-k dielectric layers 18,22 are etched with fluorocarbons alone, for example $CHF_3$ or $C_4F_8$. Etchant gas mixtures and plasma parameters for etching the various layers are well known to those in the art and can be experimentally optimized for each application. Stopping on the silicon nitride layer 46 is easily achieved by utilizing etching parameters which provide a high insulative layer-to-silicon nitride selectivity. The wafer 40 is next transferred from the etching chamber into an ashing chamber and the residual photoresist layer 56 and BARC 54 are removed. Alternately, the photoresist and BARC may be removed with a liquid stripper.

Figure 3C:
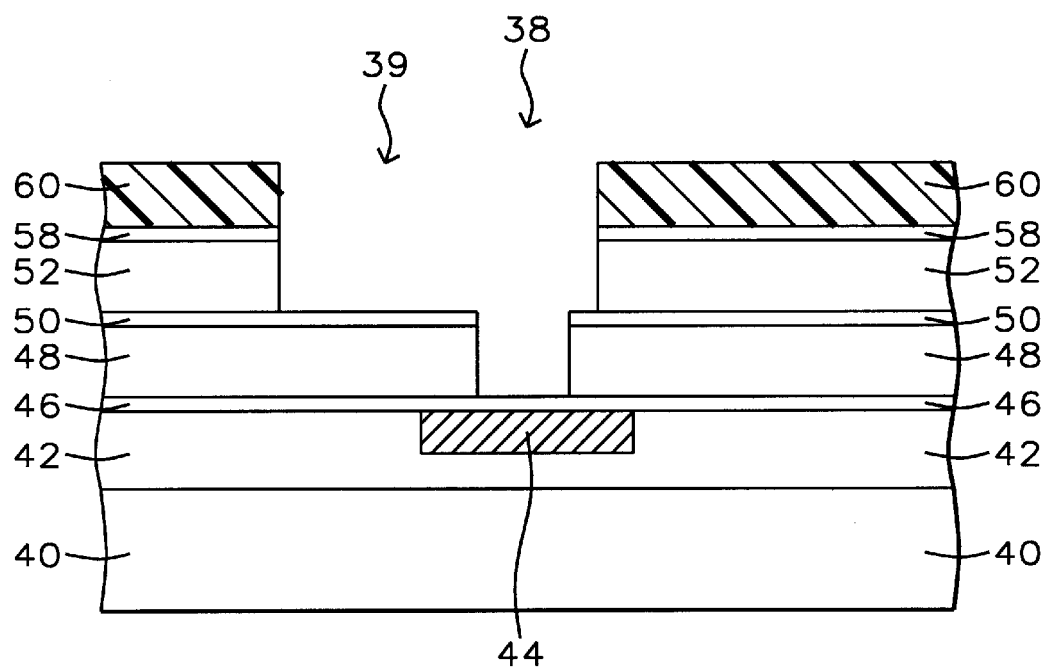
Figure 3D:
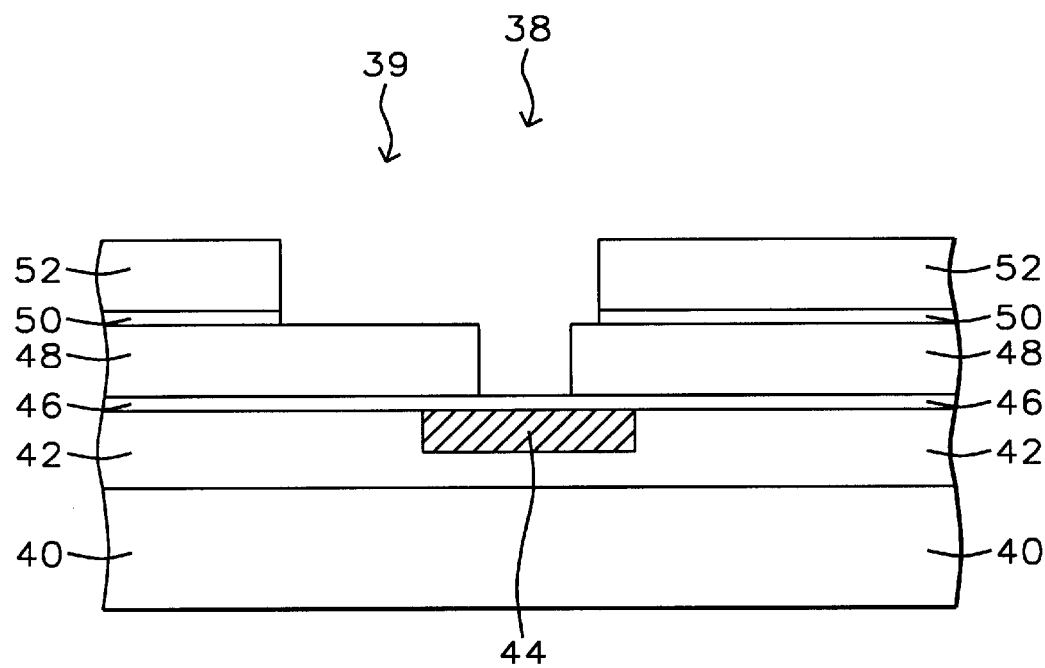

Referring to FIG. 3C a second organic BARC 58 is deposited on the wafer 40. A second photoresist layer 60 is patterned over the BARC 58 to form an image which defines a wider, trench portion 39 of the dual damascene structure which comprises a wiring pattern connecting to the via opening 38. The wiring pattern 39 is etched in a similar manner and by the same chemistry as the via etching, stopping this time, on the silicon nitride layer 50. Endpoint is again determined with an optical emission spectrometer. The wafer 40 is transferred from the etching chamber into an ashing chamber and the residual photoresist layer 60 and BARC 54 are removed by ashing in a $O_2/N_2$ plasma. Alternately, the photoresist and BARC may be removed with a liquid stripper. Portions of the silicon nitride etch stop layers 50 and 46 are next removed by dipping the wafer 10 into hot phosphoric acid. The completed dual-damascene trench opening 39 with via opening 38 is shown in FIG. 3D.

Figure 3E:
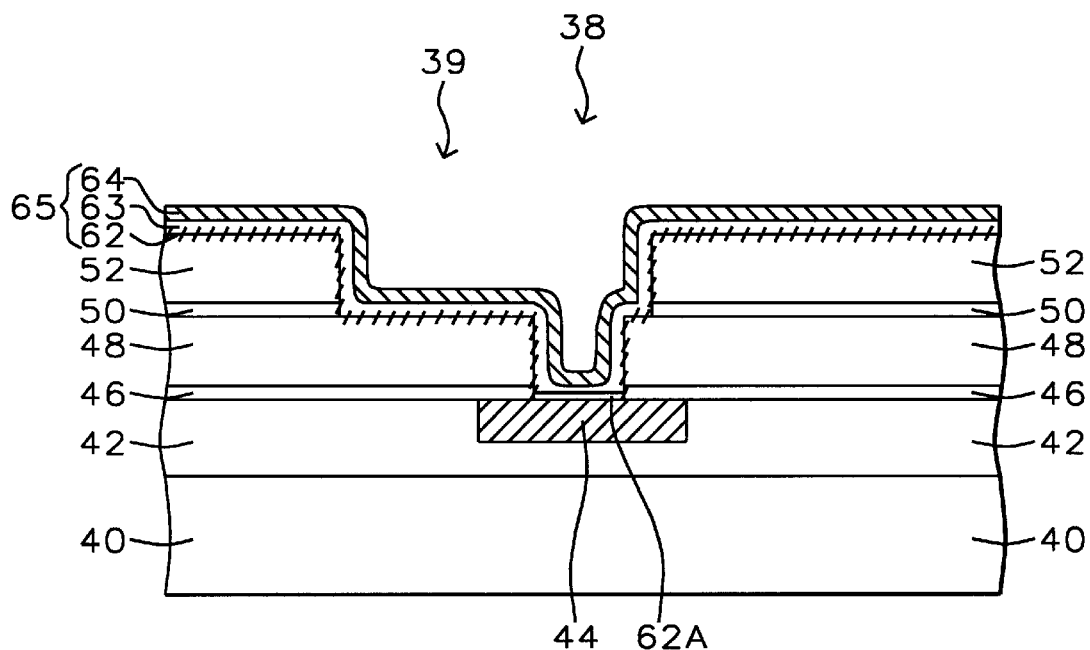

Referring to FIG. 3E, a composite barrier layer 65 is deposited onto the wafer 40 by IMP sputtering, utilizing the directional sputtering characteristics of IMP to provide good bottom coverage. The barrier layer 65 consists three laminar portions. A lower portion 62, which is deposited Ta rich, reacts with the surface of the low-k dielectric layer forming a strongly bonded, tensile stress free transition layer which becomes an adhesion layer for the remaining parts of the barrier 65. A TaN layer 63 is then deposited over the transition layer 62 to form the main barrier, and finally, a top layer of Ta 64 is deposited on the central TaN portion 63 to form a good wetting surface for the to-be-deposited copper seed layer. The three laminar components of the composite barrier layer 65 are sequentially deposited in a single pump-down operation and in the same chamber of the sputtering tool by sequentially changing gas composition and sputtering parameters. A detailed description of the formation of the composite barrier layer is as follows:

The wafer 40 is introduced into the deposition chamber of an ion metal plasma sputtering tool, for example, the Endura single-wafer, multi-chamber PVD system fitted with a Vectra IMP source, manufactured by Applied Materials Corporation of Santa Clara Calif. A deposition chamber of the tool is fitted with a tantalum sputtering target which is the tantalum source for all three components of the composite layer 65.

After initial pumpdown, the wafer is heated to a temperature of between about 90 and 110° C. Argon, at a flow rate of between about 40 and 60 SCCM is introduced into the deposition chamber. In the present embodiment in which the low-k dielectric is FSG, nitrogen is also introduced at a flow rate of between about 15 and 25 SCCM. If, in the alternative, the low-k dielectric is an OSG, for example, Black Diamond™, the nitrogen flow is omitted. The pumping speed is throttled to maintain a chamber pressure of between about 25 and 30 milliTorr. A Ta rich TaN layer 62 between about 18 and 22 Angstroms thick is deposited onto the second low-k dielectric layer 52 and into the opening 38 in the first low-k dielectric layer 48 by application of a DC power of between about 45 and 55 Watts to the Ta target, an rf power of between about 2,500 and 3,300 Watts is applied to the coil, and an rf substrate bias of between about 400 and 600 Watts is applied to the wafer 40. Under these LO/HB conditions, the Ta sputtering rate is low permitting the Ta rich layer 62 to react with the low-k dielectric layers 48 and 52 converting the Ta rich TaN to a strongly bonded, non tensile stressed adhesion layer 62, which is blended into the low-k dielectric layers.

After deposition of the adhesion layer 62, the argon gas flow in the IMP sputtering chamber is changed to between about 40 and 60 SCCM, the nitrogen flow to between about 15 and 30 SCCM and the pumping speed is throttled to maintain a total chamber pressure of between about 25 and 30 milliTorr. DC power is changed to between about 1,350 and 1,650 Watts, the RF power to between about 1,800 and 2,200 Watts, and substrate rf bias to between about 100 and 150 Watts. Under these conditions a stoichiometric TaN barrier layer 63 between about 230 and 285 Angstroms thick, as measured on the planar surface of the wafer, is deposited on the adhesion layer 62. The layer 62 is shown in FIG. 3E as a diffuse transition region, blended both into the subjacent low-k layers 48 and 52 and into the superjacent stoichiometric TaN barrier layer 63. A portion 62A of the Ta rich TaN layer 62 fuses onto the metal wiring 44.

The argon gas flow in the IMP sputtering chamber is then again changed to between about 40 and 60 SCCM, the nitrogen flow is halted, and the pumping speed is throttled to maintain a total chamber pressure of between about 25 and 30 milliTorr. DC power is changed to between about 45 and 55 Watts, the RF power to between about 2,500 and 3,300 Watts, and the substrate rf bias is set to between about 400 and 500 Watts. Under these conditions a Ta top layer 64 between about 18 and 22 Angstroms thick, as measured on the planar surface of the wafer, is deposited on the TaN layer 63. Together, the transition region 62, the TaN layer 63 and the upper Ta layer 64 form the composite barrier layer 65.

Figure 3F:
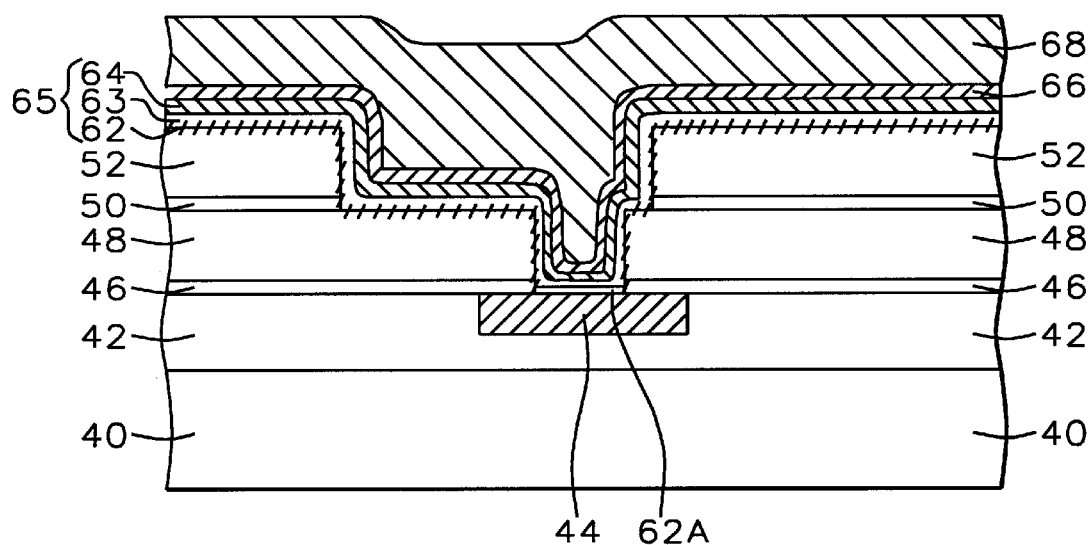

Referring to FIG. 3F a copper seed layer 66, between about 1,200 and 2,500 Angstroms thick, is deposited onto the Ta layer 64. The seed layer 66 is preferably deposited by sputtering in a second chamber of the sputtering tool used to deposit the composite TaN barrier layer 65. Alternately the copper seed layer 66 may be deposited by a CVD method. The upper Ta layer offers a better wetting surface for the copper seed layer 66 than does a corresponding conventional TaN surface, thereby reducing copper agglomeration and increasing the <111> texture of the seed layer. This improved seed layer quality, in turn, greatly improves the uniformity and quality of subsequently electrochemically deposited copper layer which forms the conductive element.

Figure 3G:
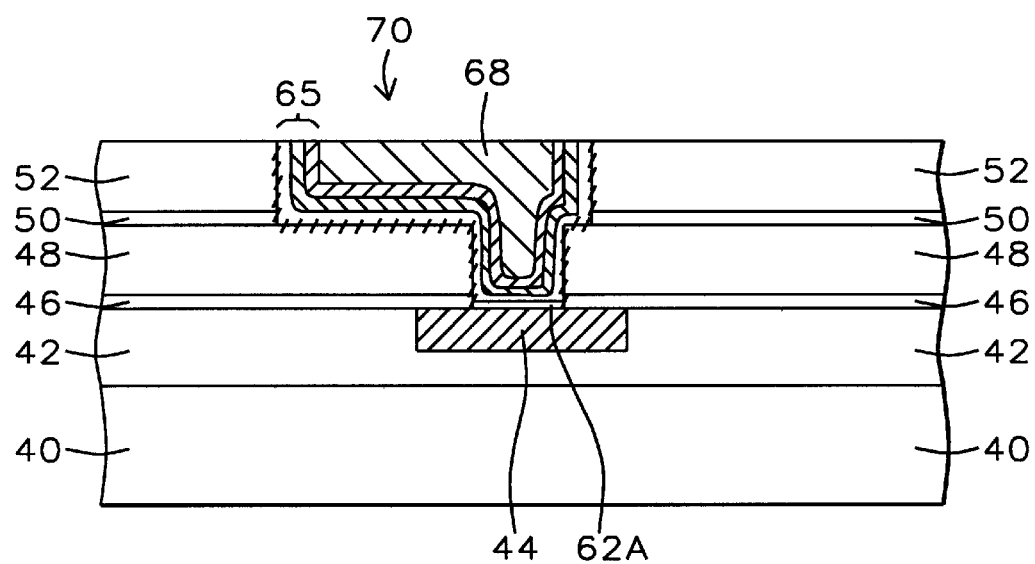

After the copper seed layer 66 is deposited, copper is electroplated onto the seed layer 66, forming a copper layer 68 which fills the openings 38,39 to above the level of the planar surface of the wafer 40. The formation of copper layers by electrochemical deposition onto copper seed layers is well known and is now widely practiced in copper damascene technology. In keeping with this technology, and referring to FIG. 3G, the excess copper over the surface region of the wafer 40 is next polished away and the surface planarized by CMP. The CMP process uses a slurry containing $Al_2O_3$ to polish the copper down through composite barrier 65 and into the low-k dielectric layer 52 resulting in an isolated copper segment embedded in the opening 38,39.

While the embodiments of the invention utilizes an FSG or OSG material to form a low-k dielectric layer, the use of other low-k materials, for example, fluorinated polyarylene polymers and silsesquioxane polymers such as HSG, are also contemplated by this invention, and may be applied to form the low-k dielectric layers for each of the two dielectric sections of the dual damascene structure.

The second embodiment describes the formation of a dual damascene structure formed with two dielectric layers. It is to be understood that the method taught by the present invention can be equally well applied to the formation of a damascene structure with a contact to a subjacent conductive element formed in a single dielectric layer.

While the invention has been particularly shown and described with reference to the preferred embodiments thereof, it will be understood by those skilled in the art that various changes in form and details may be made without departing from the spirit and scope of the invention.

What is claimed is:

1. A method for forming a barrier layer between a low-k dielectric layer and a copper layer comprising:
   (a) providing a wafer having a low-k dielectric layer;
   (b) depositing a Ta rich layer on said low-k dielectric layer by ion metal plasma sputtering under low Ta sputtering conditions whereby said Ta rich layer reacts with the surface of said low-k dielectric layer thereby forming a strongly bonded, non-tensile stressed transition layer which comprises a mixture of Ta and low-k dielectric;
   (c) directly after step (b) and without breaking vacuum, depositing a stoichiometric TaN layer on said transition layer;
   (d) directly after step (c) and without breaking vacuum, depositing a Ta layer on said stoichiometric TaN layer;
   (e) depositing a copper seed layer on said Ta layer; and
   (f) depositing a copper layer on said seed layer.

2. The method of claim 1 wherein said Ta rich layer, said stoichiometric TaN layer, and said Ta layer are deposited at a wafer temperature of between about 90 and 110° C.

3. The method of claim 1 wherein said low-k dielectric layer is selected from the group consisting of a fluorinated silicon oxide, an organosilicate glass, an organic polymer, a xerogel, an aerogel, and a polysilsesquioxane.

4. The method of claim 1 wherein said Ta rich layer and said Ta layer are between about 18 and 22 Angstroms thick.

5. The method of claim 1 wherein said low-k dielectric layer is a fluorinated silicon oxide.

6. The method of claim 5 wherein said Ta rich layer is deposited by sputtering in a plasma comprising Argon, at a flow rate of between about 40 and 60 SCCM and nitrogen at a flow rate of between about 15 and 25 SCCM while maintaining a chamber pressure of between about 25 and 30 milliTorr and with the application of a DC power of between about 45 and 55 Watts applied to said sputtering target, an RF power of between about 2,500 and 3,300 Watts, and a substrate rf bias of between about 400 and 500 Watts.

7. The method of claim 1 wherein said low-k dielectric layer is an organosilicate glass.

8. The method of claim 7 wherein said Ta rich layer is deposited by sputtering in a plasma comprising Argon, at a flow rate of between about 40 and 60 SCCM while maintaining a chamber pressure of between about 25 and 30 milliTorr and with the application of a DC power of between about 45 and 55 Watts applied to said sputtering target, an RF power of between about 2,500 and 3,300 Watts, and a substrate rf bias of between about 400 and 500 Watts.

9. The method of claim 1 wherein said stoichiometric TaN layer is between about 230 and 285 Angstroms thick.

10. The method of claim 1 wherein said stoichiometric TaN layer is deposited by sputtering in a plasma comprising Argon, at a flow rate of between about 40 and 60 SCCM and nitrogen at a flow rate of between about 15 and 30 SCCM while maintaining a chamber pressure of between about 25 and 30 milliTorr and with the application of a DC power of between about 1,350 and 1,650 Watts, an RF power of between about 1,800 and 2,200 Watts, and a substrate rf bias of between about 100 and 150 Watts.

11. A method for forming a damascene copper element in low-k dielectric layer comprising:
   (a) providing a wafer having a low-k dielectric layer over a metal element;
   (b) forming an opening in said low-k dielectric layer exposing said metal element;
   (c) depositing a Ta rich layer on said low-k dielectric layer and in said opening by ion metal plasma sputtering under low Ta sputtering conditions whereby said Ta rich layer reacts with the surface of said low-k dielectric layer thereby forming a strongly bonded, non-tensile stressed transition layer which comprises a mixture of Ta and low-k dielectric;
   (d) directly after step (c) and without breaking vacuum, depositing a stoichiometric TaN layer on said transition layer;
   (e) directly after step (d) and without breaking vacuum, depositing a Ta layer on said stoichiometric TaN layer;

(f) depositing a copper seed layer on said Ta layer;

(g) depositing a copper layer on said seed layer whereby said opening is filled to above the upper planar portion of said low-k dielectric layer; and (h) polishing said wafer to expose a planar surface of said low-k dielectric layer, thereby forming a copper damascene element in said opening.

12. The method of claim 11 wherein said Ta rich layer, said stoichiometric TaN layer, and said Ta layer are deposited at a wafer temperature of between about 90 and 110° C.

13. The method of claim 11 wherein said low-k dielectric layer is selected from the group consisting of a fluorinated silicon oxide, an organosilicate glass, an organic polymer, a xerogel, an aerogel, and a polysilsesquioxane.

14. The method of claim 11 wherein said Ta rich layer and said Ta layer are between about 18 and 22 Angstroms thick.

15. The method of claim 11 wherein said low-k dielectric layer is a fluorinated silicon oxide.

16. The method of claim 15 wherein said Ta rich layer is deposited by sputtering in a plasma comprising Argon, at a flow rate of between about 40 and 60 SCCM and nitrogen at a flow rate of between about 15 and 25 SCCM while maintaining a chamber pressure of between about 25 and 30 milliTorr and with the application of a DC power of between about 45 and 55 Watts applied to said sputtering target, an RF power of between about 2,500 and 3,300 Watts, and a substrate rf bias of between about 400 and 500 Watts.

17. The method of claim 11 wherein said low-k dielectric layer is an organosilicate glass.

18. The method of claim 17 wherein said Ta rich layer is deposited by sputtering in a plasma comprising Argon, at a flow rate of between about 40 and 60 SCCM while maintaining a chamber pressure of between about 25 and 30 milliTorr and with the application of a DC power of between about 45 and 55 Watts applied to said sputtering target, an RF power of between about 2,500 and 3,300 Watts, and a substrate rf bias of between about 400 and 500 Watts.

19. The method of claim 11 wherein said stoichiometric TaN layer is between about 230 and 285 Angstroms thick.

20. The method of claim 11 wherein said stoichiometric TaN layer is deposited by sputtering in a plasma comprising Argon, at a flow rate of between about 40 and 60 SCCM and nitrogen at a flow rate of between about 15 and 30 SCCM while maintaining a chamber pressure of between about 25 and 30 milliTorr and with the application of a DC power of between about 1,350 and 1,650 Watts, an RF power of between about 1,800 and 2,200 Watts, and a substrate rf bias of between about 100 and 150 Watts.

* * * * *